United States Patent [19]
Mueller

[11] 3,934,243
[45] Jan. 20, 1976

[54] ALPHANUMERIC DISPLAY MEANS FOR COMPUTER-LINKED TYPEWRITER CONSOLES USING A PLURALITY OF GASEOUS GLOW INDICATOR TUBE MEANS CONTAINING AN IONIZABLE GAS

[75] Inventor: Thomas Delbert Mueller, Orinda, Calif.

[73] Assignee: Chevron Research Company, San Francisco, Calif.

[22] Filed: Nov. 5, 1973

[21] Appl. No.: 413,113

[52] U.S. Cl. .......... 340/324 R; 340/336; 340/365 R
[51] Int. Cl.² .......................................... G06F 3/14
[58] Field of Search .......... 340/324 R, 324 M, 378, 340/336, 343, 166 EL, 365 R, 365 C

[56] References Cited
UNITED STATES PATENTS

| | | | |
|---|---|---|---|
| 2,769,939 | 11/1956 | Williams | 340/343 |
| 3,582,944 | 6/1971 | Kashio | 340/343 |
| 3,670,322 | 6/1972 | Mallebrein | 340/365 C |

Primary Examiner—Marshall M. Curtis
Attorney, Agent, or Firm—R. L. Freeland, Jr.; H. D. Messner

[57] ABSTRACT

The present invention relates to an alphanumeric display unit means for improving the identification quantities at selected key buttons of a computer-linked typewriter console through usage of light-emitting identification indicia attached adjacent to or at the selected key buttons. Each light-emitting display comprises a gaseous glow indicator tube means containing an ionizable gas selectively activated through controller switch means so as to provide a gas glow pattern corresponding to an alphanumeric indicium for which display is sought.

2 Claims, 6 Drawing Figures

U.S. Patent    Jan. 20, 1976    Sheet 1 of 2    3,934,243
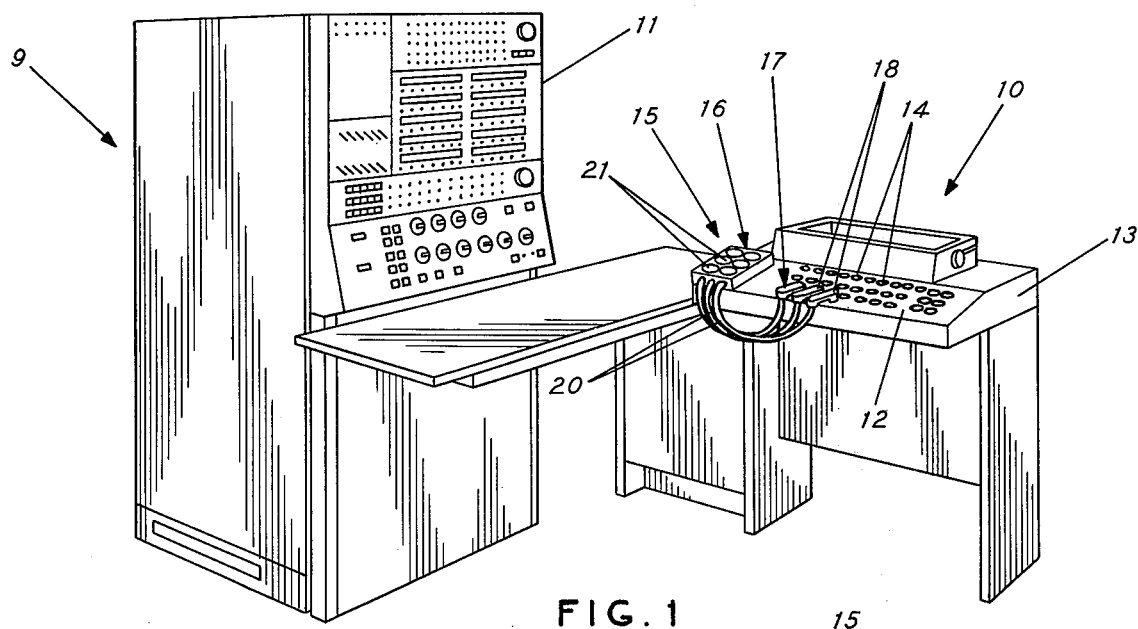
FIG.1
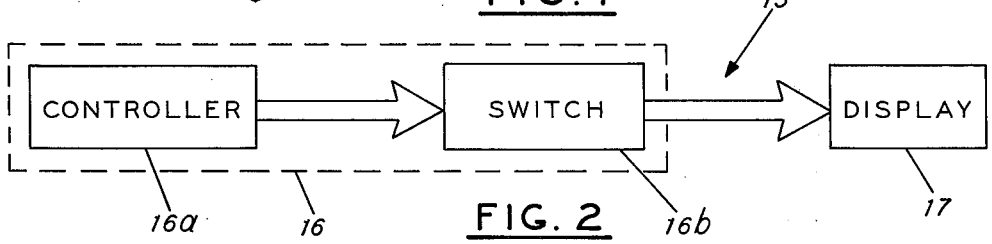
FIG.2
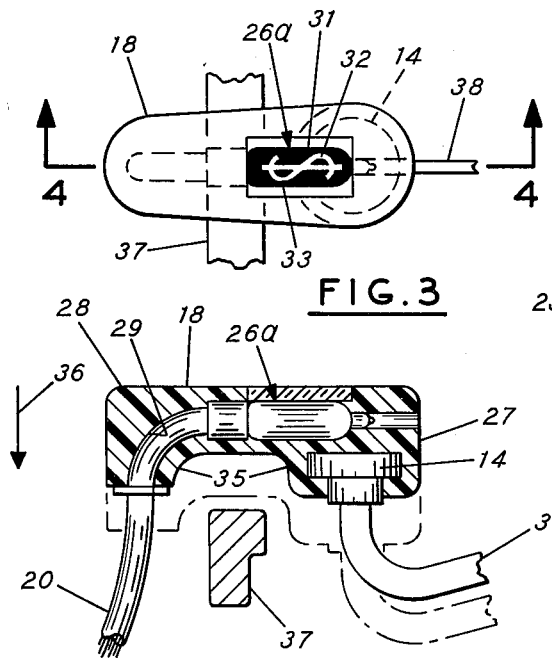
FIG.3
FIG.4
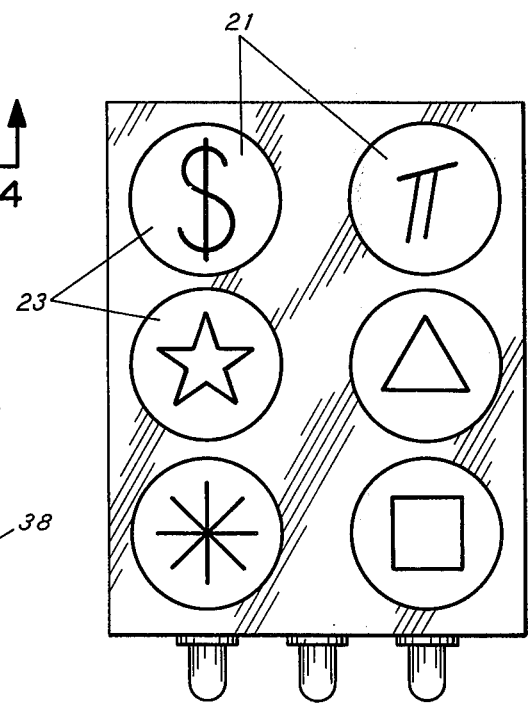
FIG.5

3,934,243

ALPHANUMERIC DISPLAY MEANS FOR COMPUTER-LINKED TYPEWRITER CONSOLES USING A PLURALITY OF GASEOUS GLOW INDICATOR TUBE MEANS CONTAINING AN IONIZABLE GAS

FIELD OF THE INVENTION

The present invention relates to key-operated typographical machines such as typewriters and the like, and more particularly, to a computer-linked typewriter console used as an input/output (I/O) linkage for a general purpose digital computer.

BACKGROUND OF THE INVENTION

Today's different programming languages (FORTRAN, PL-1, ASSEMBLY, etc.) are often used interchangeably by operators at a common computer terminal for controlling a general purpose digital computer. The number, symbols and programming keys associated with a given programming language may require any one operator to alternate a plurality of fonts at the computer-linked typewriter console; however, as is well known, each font relates to a different layout of keyboard characters.

As font changes occur, it has been proposed to employ key buttons, each bearing a plurality of characters to aid the observer-user in more efficiently using the typewriter console. It has been further proposed to fit the key buttons with adjustable plates bearing different character indicia. However, where there are a plurality of operators-users at a common typewriter console such as found at most computer terminals, numerous alphanumeric identification plates would be needed. Therefore, the above-mentioned proposals have been found to be exceedingly awkward to implement. Also, in some cases it is desirable to "highlight" certain key buttons above those displayed at adjacent buttons owing to the importance of certain programming keys being implemented at the computer terminal. None of the prior art plates provides such features.

SUMMARY OF THE INVENTION

In accordance with the present invention, selected keyboard buttons of an I/O typewriter console linked to a general purpose digital computer are provided with a plurality of tightly fitting rigid tab frame means. Onto the frame means are fitted a highly visible, light-emitting alphanumeric display means for display for key alphanumeric indicia through selective control provided by controller switch means connected thereto. Preferably the light-emitting display means includes a set of gaseous glow indicator tube ("Nixie") means, each of which comprising a plurality of indicator ("cathode") electrodes stacked one above the other (dual planar construction) within a single transparent envelope containing a ionizable gas. A single anode electrode (wire "mesh") surrounds the indicator electrodes. Each indicator electrode is selectively energizable by means of the above-mentioned controller switch means. Result: a pattern of light corresponding to the alphanumeric indicium of interest is generated.

OBJECTS OF THE INVENTION

An object of the present invention is the provision of a novel, light-emitting alphanumeric display for use at a typewriter console linked to a general purpose digital computer whereby the observer-user of the typewriter console can easily identify key lever operations irrespective of the number and/or programming language employed within the linked digital computer or at the I/O typewriter console itself.

Further objects of the invention will become apparent from a detailed description of the single embodiment given by way of example and not by way of limitation, reference being made to the accompanying drawings.

DESCRIPTION OF THE DRAWINGS

FIG. 1 is a perspective view of an I/O computer terminal which includes a typewriter console having a keyboard provided with light-emitting, alphanumeric character displays positioned at selected key buttons in accordance with the present invention;

FIGS. 2 and 6 are schematic diagrams of circuitry useful in the apparatus of the present invention;

FIG. 3 is a plan view of a tab frame means attached to a selected key button of the typewriter console of FIG. 1;

FIG. 4 is a section taken along line 4—4 of FIG. 3; and

FIG. 5 is a plan view of an array of switch buttons useful in initializing circuit components within the apparatus of the present invention.

DESCRIPTION OF A DETAILED EMBODIMENT

Figure 6:
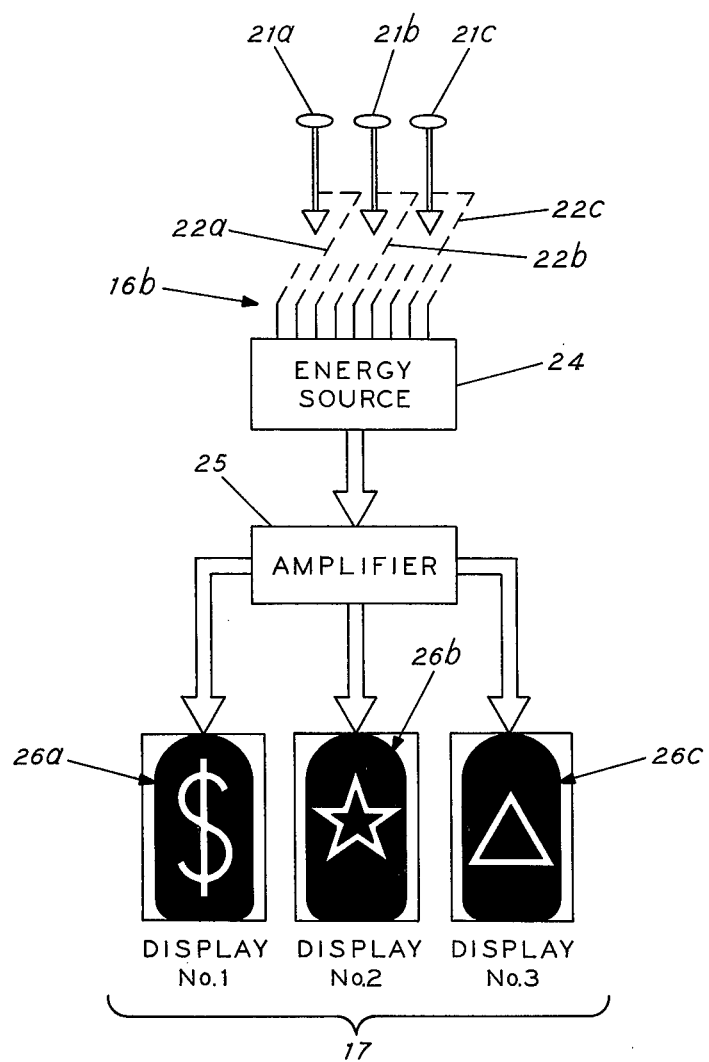

FIG. 1 illustrates a computer terminal 9. The computer terminal 9 includes an I/O typewriter console 10 useful in linking digital information to a general purpose digital computer (not shown). Information can also be linked to the computer by I/O devices other than the typewriter console 10. For this purpose, such associated I/O devices can be housed within cabinet 11.

Typewriter console 10 is seen to comprise a keyboard 12 visible above housing 13. The observer-user utilizes key buttons 14 to depress levers (not shown) by which conventional font-paper interaction occurs while, simultaneously, the data is transmitted to the general purpose digital computer. Keyboard 12 is conventionally arranged; e.g., as a series of rows and columns. Due to the fact that different programming languages employed by various observer-users for computer control purposes may use numerous characters, symbols and keys not readily interrelated, there is a definite need for identification means for attachment to selected key buttons 14. Preferably such identification means should highlight the display irrespective of the background lighting environment at the computer terminal 9.

In accordance with the present invention, such a display can be provided through a novel, light-emitting display unit 15 attached to the typewriter console 10. In general, it comprises a controller switch unit 16 attached, say, to the housing 13 of the typewriter console 10, and an alphanumeric indicating unit 17 including a rigid frame means 18. Also of importance: transfer bundle means 20 connected between the controller switch unit 16 and the display unit 17. Each of the aforementioned elements will now be described in detail.

Controller Switch Unit 16

As FIG. 1 illustrates, the controller switch unit 16 should be placed within arm's length of the observer-user seated at the typewriter console 10. To the broad horizontal surface of the unit are attached a series of buttons 21. Purpose: to effectuate control of a series of switch elements whereby sets of electrical signals, say generated by controller 16a of FIG. 2, can pass through switch circuit 16b to the indicating unit 17, as described in detail below.

FIG. 5 illustrates the arrangement of the buttons 21 in more detail.

As shown the buttons 21 are arranged in an array comprising orthogonal columns and rows. In addition each button is provided with an identification tag 23 at its broad surface to provide easy identification indicia to the observer-user. Operations of the buttons are straightforward: downward movement of each button will cause switch elements (not shown) to change operational state, either from an active to an inactive one or vice versa.

In more detail, as shown in FIG. 6, depression of the buttons 21a, 21b or 21c activates mechanical linkages 22a, 22b or 22c to set switch elements of the switch circuit generally indicated at 16b. In that way energy output from an electrical source 24 can pass through amplifier circuit 25 to activate a set of gaseous glow discharge indicator tubes 26a, 26b and 26c comprising the indicating unit 17 as explained below in detail.

Indicating Unit 17

The indicating unit 17 in general and a gaseous glow discharge tube 23a in particular are illustrated in detail in FIGS. 3 and 4.

As shown in FIG. 4, the gaseous glow discharge indicator tube 26a is supported on the elongated rigid frame means 18 previously mentioned. The frame means 18 is attached, cantilever style, at end 27 to key button 14. At the opposite unsupported end 28, the rigid frame means 18 is seen to be fitted with a bore 29. The bore 29 receives transfer bundle means 20. Transfer bundle means 20 comprises a series of electrical conductors. These conductors connected to electrodes of the gaseous discharge indicator tube 26a.

The indicator display tube 26a is of the gaseous glow type. As shown in FIG. 3, it typically comprises an enclosed bulbous transparent envelope 31 surrounding a plurality of indicator cathode electrodes 32 stacked in multiple planes, as one above the other in a tier, all surrounding a single wire mesh anode electrode 33. An ionizing gas such as neon resides within the envelope. In operation, the display tube 26a emits light in accordance with the shape of one of the plurality of indicator electrodes 32 when the appropriate cathode and anode electrodes are activated. However, it should be noted that since there are a plurality of indicator electrodes stacked one above the other in different planes within the indicator tube 26a, multiple displays can also be provided if desired. Such multiple displays are well known in the art and are typically referred to as Nixie displays.

Over the central region of the rigid frame means 18 can be provided a reduced portion forming steps 35. In that way depression of the frame means 18 in the direction of arrow 36 by the observer-user allows the frame means 18 to clear transverse bar 37 of the typewriter housing. Accordingly, transfer of movement via the key button 14 and key lever 38 is likewise free of hindrance.

While certain preferred embodiments of the invention have been specifically disclosed, it should be understood that the invention is not limited thereto. For example, if the dimensions of each gaseous discharge display tube can be sufficiently reduced, each key button 14 may be sufficient to support the former without the need for a separate frame support means. In such an arrangment the key button 14 may need only be provided with a bore to directly accept the transfer bundle means 20 and the gaseous glow indicator tube. Accordingly, as many variations will be readily apparent to those skilled in the art, the invention should be given a broad interpretation in accordance with the following claims.

I claim:

1. A device for displaying alphanumeric light-emanating indicia at selected key buttons on a keyboard of a typewriter console forming an I/O link with a general purpose digital computer, each light-emanating alphanumeric indicium being related to a font operational characteristic resulting from movement of one of said selected key buttons under control of a human observer-user whereby accurate permanent recordation on paper through mechanical button-font-paper interactions of said font characteristic occurs, comprising;

a. a set of gaseous glow indicator tube means each comprising a plurality of indicia-shaped indicator cathode electrodes stacked one above the other surrounding a single anode electrode, deployed within a transparent bulbous envelope containing an ionizable gas, said envelope being positioned to display at or adjacent to at least one of said selected key buttons to said observer-user said light-emanating alphanumeric indicium associated with said font operational characteristic;

b. elongated rigid cantilevered frame means attached to and supportive of each of said gaseous glow indicator tube means, said frame means including cooperative means in gripping contact with corresponding key buttons of said keyboard;

c. controller switch means operatively connected to said set of indicator tube means and including cooperative means for generating a series of signals for energization of selected cathode and anode electrodes of said indicator tube means so as to provide gas glow thereabout in patterns corresponding to said alphanumeric display indicia for which display is sought, said displayed alphanumeric indicia being of sufficient intensity so as to be easily discernible to said human observer-user using said typewriter console irrespective of the background lighting environment thereabout.

2. Device of claim 1 in which each of said set of gaseous glow indicator tube means is supported interior of said one key button of said keyboard, each indicator tube being viewable at the finger-touching surface of said one key button.

* * * * *